(12) United States Patent
Papasouliotis et al.

(10) Patent No.: US 7,482,247 B1
(45) Date of Patent: Jan. 27, 2009

(54) CONFORMAL NANOLAMINATE DIELECTRIC DEPOSITION AND ETCH BAG GAP FILL PROCESS

(75) Inventors: George D. Papasouliotis, North Andover, MA (US); Raihan M. Tarafdar, San Jose, CA (US); Ron Rulkins, Milpitas, CA (US); Dennis M. Hausmann, Lake Oswego, OR (US); Jeff Tobin, Mountain View, CA (US); Adrianne K. Tipton, Pleasanton, CA (US); Bunsen Nie, Fremont, CA (US); Wai-Fan Yau, Los Altos, CA (US); Brian G. Lu, Fremont, CA (US); Timothy M. Archer, Lake Oswego, OR (US); Sasson Roger Somekh, Los Altos Hills, CA (US)

(73) Assignee: Novellus Systems, Inc., San Jose, CA (US)

( * ) Notice: Subject to any disclaimer, the term of this patent is extended or adjusted under 35 U.S.C. 154(b) by 150 days.

(21) Appl. No.: 11/524,502

(22) Filed: Sep. 19, 2006

Related U.S. Application Data

(63) Continuation-in-part of application No. 11/026,563, filed on Dec. 30, 2004, now abandoned.

(51) Int. Cl.
*H01L 21/311* (2006.01)

(52) U.S. Cl. .............. 438/437; 438/789; 257/E21.245; 257/E21.546

(58) Field of Classification Search ............... 438/437, 438/789, FOR. 227; 257/E21.245, E21.546
See application file for complete search history.

(56) References Cited

U.S. PATENT DOCUMENTS 5,314,724 A    5/1994  Tsukune et al.

(Continued)

FOREIGN PATENT DOCUMENTS

| WO | WO02/27063 | 4/2002 |
|---|---|---|
| WO | WO 03/083167 A1 | 9/2003 |

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner*—George Fourson
(74) *Attorney, Agent, or Firm*—Weaver Austin Villeneuve & Sampson LLP

(57) ABSTRACT

Conformal nanolaminate dielectric deposition and etch back processes that can fill high aspect ratio (typically at least 5:1, for example 6:1), narrow width (typically sub 0.13 micron, for example 0.1 micron or less) gaps with significantly reduced incidence of voids or weak spots involve the use of any suitable confirmal dielectric deposition technique and a dry etch back. The etch back part of the process involves a single step or an integrated multi-step (for example, two-step) procedure including an anisotropic dry etch followed by an isotropic dry etch. The all dry deposition and etch back process in a single tool increases throughput and reduces handling of wafers resulting in more efficient and higher quality nanolaminate dielectric gap fill operations.

27 Claims, 7 Drawing Sheets

U.S. PATENT DOCUMENTS

| | | | |
|---|---|---|---|
| 5,525,550 | A | 6/1996 | Kato |
| 5,527,561 | A | 6/1996 | Dobson |
| 5,597,395 | A | 1/1997 | Bocko et al. |
| 5,705,028 | A | 1/1998 | Matsumoto |
| 5,985,770 | A | 11/1999 | Sandhu et al. |
| 6,030,881 | A | 2/2000 | Papasouliotis et al. |
| 6,064,104 | A | 5/2000 | Omid-Zohoor et al. |
| 6,102,993 | A | 8/2000 | Bhandari et al. |
| 6,133,160 | A | 10/2000 | Komiyama et al. |
| 6,184,108 | B1 | 2/2001 | Omid-Zohoor et al. |
| 6,184,143 | B1 | 2/2001 | Ohashi et al. |
| 6,300,219 | B1 | 10/2001 | Doan et al. |
| 6,335,261 | B1 | 1/2002 | Natzle et al. |
| 6,352,953 | B1 | 3/2002 | Seki et al. |
| 6,372,669 | B2 | 4/2002 | Sandhu et al. |
| 6,503,330 | B1 | 1/2003 | Sneh et al. |
| 6,504,233 | B1 | 1/2003 | Gorczyca et al. |
| 6,511,539 | B1 | 1/2003 | Raaijmakers |
| 6,531,377 | B2 | 3/2003 | Knorr et al. |
| 6,540,838 | B2 | 4/2003 | Sneh et al. |
| 6,551,339 | B2 | 4/2003 | Gavronsky |
| 6,551,399 | B1 | 4/2003 | Sneh et al. |
| 6,624,091 | B2 | 9/2003 | Yuan |
| 6,780,789 | B1 | 8/2004 | Yu et al. |
| 6,784,101 | B1 | 8/2004 | Yu et al. |
| 6,802,944 | B2 | 10/2004 | Ahmad et al. |
| 6,867,152 | B1 | 3/2005 | Hausmann et al. |
| 6,903,005 | B1 | 6/2005 | Marsh |
| 6,908,862 | B2 | 6/2005 | Li et al. |
| 6,949,481 | B1 | 9/2005 | Halliyal et al. |
| 6,984,591 | B1 | 1/2006 | Buchanan et al. |
| 7,097,878 | B1 | 8/2006 | Rulkens et al. |
| 7,129,189 | B1 | 10/2006 | Hausmann et al. |
| 7,148,155 | B1 | 12/2006 | Tarafdar et al. |
| 7,163,899 | B1 | 1/2007 | Cho et al. |
| 7,202,185 | B1 | 4/2007 | Hausmann et al. |
| 7,223,707 | B1 | 5/2007 | Papasouliotis et al. |
| 2001/0049205 | A1 | 12/2001 | Sandhu et al. |
| 2002/0102365 | A1* | 8/2002 | Narasimhan et al. ........ 427/569 |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0134741 | A1 | 7/2003 | Weisbeck et al. |
| 2003/0157781 | A1 | 8/2003 | Macneil et al. |
| 2004/0025787 | A1 | 2/2004 | Selbrede et al. |
| 2004/0043149 | A1 | 3/2004 | Gordon et al. |
| 2004/0043569 | A1 | 3/2004 | Ahn et al. |
| 2004/0079728 | A1 | 4/2004 | Mungekar et al. |
| 2004/0092095 | A1* | 5/2004 | Nguyen et al. .............. 438/627 |
| 2004/0222490 | A1 | 11/2004 | Raaijmakers et al. |
| 2004/0247787 | A1 | 12/2004 | Mackie et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2005/0271813 | A1 | 12/2005 | Kher et al. |
| 2006/0087000 | A1 | 4/2006 | Okuno |
| 2006/0127578 | A1 | 6/2006 | Li et al. |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4 + O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapour Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution of Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Function Groups on Atmospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Ritala et al., "Atomic Layer Deposition", Handbook of Thin Films Materials, vol. 1, 2002, pp. 103-159.

Rulkens et al., "Methods for the use of Alkoxysilanol Precursors for Vapor Deposition of $SiO_2$ Films", Novellus System, Inc., filed Dec. 23, 2004, U.S. Appl. No. 11/021,558, pp. 1-24.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

Cho et., "Hydroxyl Bond Removal and Film Densification Method for Oxide Films Using Microwave Post Treatment", Novellus Systems, Inc., U.S. Appl. No. 11/280,076, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Apr. 25, 2006, from U.S. Appl. No. 11/021,558.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Jul. 7, 2006, from U.S. Appl. No. 10/875,158.

U.S. Office Action mailed Sep. 27, 2006, from U.S. Appl. No. 11/021,558.

U.S. Office Action mailed Sep. 27, 2006, from U.S. Appl. No. 11/026,284.

U.S. Office Action mailed Sep. 29, 2006, from U.S. Appl. No. 11/027,480.

U.S. Office Action mailed Jan. 16, 2007, from U.S. Appl. No. 10/874,696.

U.S. Office Action mailed May 8, 2006, from U.S. Appl. No. 11/327,668.

U.S. Office Action mailed Mar. 21, 2007, from U.S. Appl. No. 11/414,459.

U.S. Office Action mailed Apr. 13, 2007, from U.S. Appl. No. 11/026,284.

U.S. Office Action mailed Jul. 7, 2006, from U.S. Appl. No. 10/875,158.

U.S. Office Action mailed Mar. 23, 2007, from U.S. Appl. No. 11/021,558.

Papasouliotis et al., "Pulsed Deposition Layer Gap Fill With Expansion Material," Novellus Systems, Inc., U.S. Appl. No. 11/414,459, filed Apr. 28, 2006, pp. 1-28.

* cited by examiner

CONFORMAL NANOLAMINATE DIELECTRIC DEPOSITION AND ETCH BAG GAP FILL PROCESS

CROSS-REFERENCE TO RELATED APPLICATIONS

This application is a continuation-in-part of U.S. patent application Ser. No. 11/026,563 filed Dec. 30, 2004, now abandoned titled MULTI-STEP NANOLAMINATE DIELECTRIC DEPOSITION AND ETCH BACK GAP FILL PROCESS, incorporated herein by reference in its entirety for all purposes.

BACKGROUND OF THE INVENTION

This invention relates to electronic device fabrication processes and associated apparatus. More specifically, the invention relates to conformal nanolaminate deposition and dry etch processes for forming dielectric layers, particularly in high aspect ratio, narrow width recessed features.

It is often necessary in semiconductor processing to fill a high aspect ratio gap with insulating material. As device dimensions shrink and thermal budgets are reduced, void-free filling of high aspect ratio spaces (e.g., AR>3.0:1) becomes increasingly difficult due to limitations of existing deposition processes. The method currently used for high aspect ratio (AR) gap-fill is deposition of doped or undoped silicon dioxide assisted by high density plasma chemical vapor deposition (HDP CVD), a directional (bottom-up) CVD process. Evolving semiconductor device designs and dramatically reduced feature sizes have resulted in several applications where HDP processes are challenged in filling the high aspect ratio structures (e.g., AR>7:1) using existing technology (see, for example, U.S. Pat. No. 6,030,881 and U.S. Pat. No. 6,846,745). For structures representative of the 65 nm and 45 nm technology nodes, engineering the gap fill process becomes structure dependent, requiring that the process be re-optimized, a task of considerable complexity, every time a new structure needs to be filled.

Accordingly, improved gap fill techniques, particularly for gap fill of small, high aspect ratio structures, are needed.

SUMMARY OF THE INVENTION

The present invention addresses this need by providing conformal nanolaminate dielectric deposition (e.g., rapid vapor deposition (RVD); also referred to as pulsed deposition layer (PDL) processing, or ALD) and etch back processes that can fill high aspect ratio (typically at least 5:1, for example 6:1), narrow width (typically sub 0.13 micron, for example 0.1 micron or less) gaps with significantly reduced incidence of voids or weak spots.

The deposition part of the process may involve the use of any suitable conformal nanolaminate dielectric deposition process, in particular a RVD or ALD process. A suitable process involves exposing the gap containing substrate surface to a catalyst or catalyst-containing precursor gas to form a saturated layer of metal-containing precursor on the substrate surface, and then exposing the substrate surface to a silicon-containing precursor gas to form a conformal dielectric film layer.

The etch back part of the process is a plasma-based dry etch using isotropic or a combination of isotropic and anisotropic chemistry and process conditions. Various etch apparatus, chemistry and conditions may be used. Suitable plasma reactors for conducting the etch have RF and/or microwave sources that generate capacitively coupled plasmas or inductively coupled plasmas (ICP).

In one embodiment, the etch back part of the process involves an integrated multi-step (for example, two-step) procedure including an anisotropic dry etch followed by an isotropic dry etch. This etch back part of the process may involve any suitable dry etch techniques, for example a reactive ion etch (RIE) using anisotropic chemistry followed by a downstream plasma etch using isotropic chemistry. A single step partially isotropic etch back process may also be used. Suitable plasma reactors with both radio frequency (RF) or microwave in-situ and/or downstream plasma sources are available to accomplish these etch back techniques.

After etching, it may be advantageous to passivate the dielectric layer to mitigate the detrimental effects of fluorine. In one embodiment, the passivation process includes treatment with a hydrogen-containing plasma performed in the same chamber as the etch back process. Relevant details of the etch back and passivation process can be found in U.S. Pat. No. 6,846,745 titled "High-Density Plasma Process For Filling High Aspect Ratio Structures," incorporated by reference herein.

The avoidance of wet etch chemistry facilitates the combination of both deposition and etch reactors in a single tool. All dry deposition and etch back process in a single tool with multiple reactor chambers increases throughput and reduces handling of wafers resulting in more efficient and higher quality gap fill operations.

In one aspect, the invention pertains to a method of filling gaps on a semiconductor substrate. The method involves partially filling a gap on a semiconductor substrate with dielectric using a conformal dielectric deposition process involving exposing the substrate surface to a catalyst or catalyst-containing precursor gas to form a catalyst-activated substrate surface, and then exposing the catalyst-activated substrate surface to a silicon-containing precursor gas to form a dielectric film layer. Before the gap is filled, dielectric deposited in the gap is partially removed from the gap opening and sidewalls by an etch back process, such as a multi-step etch back process comprising an anisotropic dry etch followed by an isotropic dry etch. Optionally, a passivation step is performed to mitigate the detrimental effects of the etchant gas. Then, further filling of the partially filled gap by the conformal dielectric deposition process is conducted. The etch and deposition operations can be repeated until the gap is filled.

Apparatus for accomplishing the methods of the invention are also provided.

These and other features and advantages of the present invention are described below where reference to the drawings is made.

DETAILED DESCRIPTION OF THE INVENTION

Figure 1A:
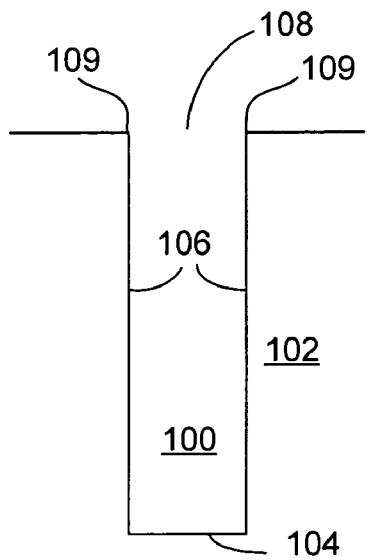
FIGS. 1A-D depict rough schematic cross-sectional diagrams of a multi-step gap fill process in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to conformal nanolaminate dielectric (e.g., silica nanolaminate) deposition (e.g., rapid vapor deposition (RVD); also referred to as pulsed deposition layer (PDL) processing, or ALD) and etch back processes that can fill high aspect ratio (typically at least 5:1, for example 6:1), narrow width (typically sub 0.13 micron, for example 0.1 micron or less) gaps with significantly reduced incidence of voids or weak spots.

The deposition part of the process may involve the use of any suitable conformal nanolaminate dielectric deposition process, in particular RVD or ALD. A suitable process involves exposing the gap containing substrate surface to a catalyst or catalyst-containing precursor gas to form a saturated layer of catalyst on the substrate surface (a catalyst-activated substrate surface), and then exposing the substrate surface to a silicon-containing precursor gas to form a conformal dielectric film layer.

In a preferred embodiment, and RVD (PDL) deposition process is used. Various RVD process precursors may be used in preferred embodiments of the invention. For example, a catalytic metal-containing precursor can be an aluminum-containing precursor, such as hexakis(dimethylamino) aluminum or trimethyl aluminum. The formation of silica films by a RVD process can also alternatively be catalyzed by metal and metalloid-free compounds, such as acidic compounds, for example phosphoric acid ($H_3PO_4$).

The etch back part of the process is a plasma-based dry etch using isotropic or a combination of isotropic and anisotropic chemistry and process conditions. Various etch apparatus, chemistry and conditions may be used. Suitable plasma reactors for conducting the etch have RF and/or microwave or inductively coupled plasma (ICP) plasma sources.

In one embodiment, the etch back part of the process involves an integrated multi-step (for example, two-step) procedure including an anisotropic dry etch followed by an isotropic dry etch. This etch back part of the process may involve any suitable dry etch techniques, for example a reactive ion etch (RIE) using anisotropic chemistry followed by a downstream plasma etch using isotropic chemistry. A single step isotropic etch back process or other combined anisotropic and isotropic etch back process may also be used. Suitable plasma reactors with both radio frequency (RF) or microwave in situ and/or downstream plasma sources are available to accomplish these etch back techniques.

After etching, it may be advantageous to passivate the dielectric layer to mitigate the detrimental effects of fluorine. In one embodiment, the passivation process includes treatment with a fluorine-scavenging plasma (e.g., a hydrogen-containing plasma) performed in the same chamber as the etch back process.

The avoidance of wet etch chemistry facilitates the combination of both deposition and etch reactors in a single tool. Having all dry deposition and etch back process in a single tool with multiple reactor chambers increases throughput and reduces wafer handling resulting in more efficient and higher quality gap fill operations.

The present invention will now be described in detail, primarily with reference to RVD processes for the deposition component of the gap fill process. It should be understood that ALD or other conformal deposition processes may also by used for gap fill in accordance with the invention. Relevant details of ALD processes in general are described in M. Ritala and M. Leskela, "Atomic layer deposition", Chapter 2, Handbook of thin film materials, vol. 1, "Deposition and processing of thin films", Hari Singh Nalwa, Ed. (Academic Press, 2002). Given these details and the description provided herein, one of skill in the art would be able to implement the ALD aspect of the invention.

RVD (PDL) processes can be used for depositing conformal silicon dioxide films. The RVD processes, in addition to their gap fill capability, have the advantage of simplicity. In the previous dielectric gap fill applications, many critical features were filled after just three or four RVD process cycles (each depositing approximately 150 Å). However, the present invention address concerns regarding seam formation at the interface of parallel deposition fronts in the center of a gap being filled. In addition, a typical conformal process cannot fill reentrant structures (a gap feature having a profile that is narrower at its opening than below the surface) which are encountered often at the STI and PMD levels of the microelectronic device. The invention extends conformal deposition techniques to gap fill of reentrant structures.

The method involves a multi-step process. The first step is carried out using a conformal dielectric deposition method, such as RVD or ALD. The second step encompasses an etch process, which removes material from the top of the structure preferentially, without exposing feature corners. An optional passivation step may be performed to scavenge the remaining etchant species. Subsequent conformal gap fill (e.g., RVD) operations are conducted to continue filling the gap. The etch/deposition cycle can then be repeated until the structure is filled. The etch and passivation steps can be carried out in situ, or in a different chamber, for example in a cluster tool with different chambers without a vacuum break.

Multi-Step Conformal Deposition and Etch Back Process

FIGS. 1A-D depict rough schematic cross-sectional diagrams of a multi-step conformal deposition and etch back gap fill process in accordance with the present invention. FIG. 1A depicts a trench (gap) 100 on a semiconductor substrate 102 requiring filling with a dielectric. The gap may be defined by its features, namely its bottom 104, sidewalls 106 and entry region (top) 108, defined by corner regions 109. The gap 100 is sometimes lined with a barrier layer, such as silicon nitride. In this case, a thin layer (e.g., 10-200 Å, for example 100 Å) of silicon nitride is formed on the gap bottom 104 and sidewalls 106 prior to being filled with dielectric. A pad nitride also generally exists at the entry region 108, on the substrate surface surrounding the gap 100.

The present invention, while applicable to the filling of any gap requiring dielectric fill, is particularly suited to gap fill of high aspect ratio, narrow width gaps. For example, the gap 100 may have a high aspect ratio, for example about 6:1 and a narrow width, for example about or less than 1000 Å. In particular, the invention facilitates gap fill for high aspect ratio features at the 45 nm node level and below.

Figure 1B:
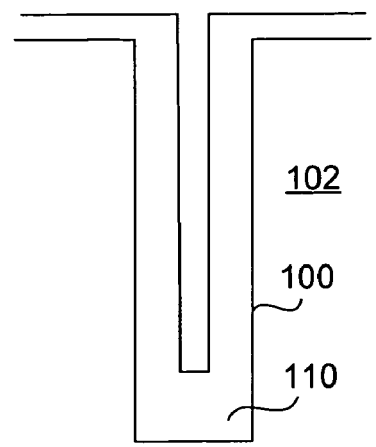

Referring to FIG. 1B, in an initial step in a multi-step gap fill process in accordance with the present invention, the gap 100 is partially filled with a conformal dielectric 110. While the invention is not necessarily so limited, the following description will be primarily described with reference to RVD (PDL), a preferred embodiment of the invention. Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained; a conformal dielectric film results. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired quantity of B is delivered, the flow of B is stopped. There may be an optional soak time after stopping the delivery of B, to allow enough time to fully complete the reaction. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react in the gas phase. The products of the homogeneous reactions then react on the substrate surface leading to film formation that is non-conformal. For high aspect ration gap fill, the high density plasma HDP variant of CVD is preferred. This technique produces generally bottom-up gap fill. Thus, RVD methods differ from CVD since in RVD the chemical reactant gases are individually injected into a reaction chamber and not allowed to mix prior to contacting the substrate surface; that is, RVD is based on separated surface-controlled reactions. Also, RVD results in conformal, rather than non-conformal (e.g. bottom-up gap fill) film deposition.

Another conformal deposition technique related to RVD is atomic layer deposition (ALD). RVD and ALD are both surface-controlled reactions involving alternately directing the reactants over a substrate surface. Conventional ALD, however, depends on self-limiting typically monolayer producing reactions for both reactant gases. As an example, if reactants C and D are first and second reactant gases for an ALD process, after C is adsorbed onto the substrate surface to form a saturated layer, D is introduced and reacts only with adsorbed C. In this manner, a very thin and conformal film can be deposited. In RVD, as previously described using exemplary reactants A and B, after A is adsorbed onto the substrate surface, B reacts with adsorbed A and is further able to react to accumulate a self-limiting, but much thicker than one monolayer film. Thus, as stated previously, the RVD process allows for rapid film growth similar to using CVD methods but with the conformality of ALD type methods. In the RVD aspect of the present invention, this further accumulation of film is accomplished by a catalytic polymerization, which will be discussed in further detail below.

The differences between conventional ALD and RVD film formation are principally due to the difference between the thicknesses of the films formed after the completion of each type of process and arise from the nature of the species used in the initial layer. In ALD, a single exposure to a, typically, metal-containing precursor leads to the formation of a monolayer of the product film (generally less than 5 Å thick), while in RVD, the metal-containing precursor, for example, catalyzes formation of more than a monolayer of silica film. The typical growth is greater than 150 Å/cycle. For example, a catalytic metal-containing precursor for a silica RVD process can be an aluminum-containing precursor, such as hexakis (dimethylamino) aluminum or trimethyl aluminum. As noted above and further described below, the formation of RVD silica films can also alternatively be catalyzed by metal- and metalloid-free compounds, such as acidic compounds, for example phosphoric acid ($H_3PO_4$).

In a RVD process in accordance with the invention, the catalytic compound (the example of trimethyl aluminum is used in the present description in accordance with a preferred embodiment)-containing precursor gas is pumped into the deposition chamber so as to substantially saturate the surface with the aluminum-containing precursor. Any suitable aluminum-containing precursor that can sufficiently adsorb onto the substrate surface and sufficiently react with the subsequently added silicon-containing precursor may be used. In addition, the aluminum-containing precursor should be capable of aiding the catalytic polymerization of the subsequently added silicon-containing precursor to produce a film thicker than a monolayer. In preferred embodiments, for example, hexakis(dimethylamino)aluminum ($Al_2(N(CH_3)_2)_6$) or trimethylaluminum ($Al(CH_3)_3$) are used. Other suitable aluminum-containing precursors include, for example, triethylaluminum ($Al(CH_2CH_3)_3$) or aluminum trichloride ($AlCl_3$).

Note that any suitable metal containing precursor that can sufficiently adsorb onto the substrate surface and sufficiently react with the subsequently added silicon-containing precursor to form a dielectric layer that is more than a monolayer thick may be used in place of the aluminum-containing precursor. In general, the metals are transition metals. Other metal-containing precursors that can be deposited to reactivate the catalytic surface include, but are not limited to, organometallic compounds of other transition metals, including zirconium, hafnium, gallium, titanium, niobium and tantalum.

As indicated earlier, forming a saturated layer is a self-limiting process and to a certain extent independent of process conditions. Relevant process conditions can include substrate (e.g., wafer) temperature, reactor pressure, reactant dosage, reactant partial pressure, and reactant gas feed composition, and combinations thereof. Pressures can range broadly, e.g., between about 1 mTorr and 760 Torr. Typical pressures range between about 10 mTorr and 5 Torr and typical wafer temperatures range between about 20 and 300 degrees Celsius. Flow rates of aluminum-containing precursor gas can range broadly, e.g., between about 1 and 10000 sccm. Preferred flow rates of an aluminum-containing precursor gas range between about 1 and 1000 sccm. The dose of aluminum-containing precursor can range broadly, e.g., between about 0.001 milligrams and 10 grams. Typical aluminum-containing precursor doses range between about 0.01 and 0.1 grams. Exposure times suitable for forming a saturated layer are typically only seconds. In some embodiments, for example, an exposure time of about 1 to 2 seconds is found to be sufficient.

The formation of silica films by RVD can also alternatively be catalyzed by metal and metalloid-free compounds, such as acidic compounds, for example phosphoric acid ($H_3PO_4$). Metal- and metalloid-free compounds suitable as catalysts in a RVD process include organic acids (e.g., acetic acid), anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids (e.g., phosphoric acid), anhydrides of inorganic acids, and combinations thereof.

For a metal- and metalloid-free catalyst, pressures can range broadly, e.g., between about 1 mTorr and 760 Torr. Typical pressures range between about 10 mTorr and 5 Torr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 1000 sccm. Catalysts may also alternatively be delivered to the reactor and/or the substrate surface in the liquid phase. Suitable liquid phase delivery flow rates can be between 0.01 and 1000 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 1 to 10 seconds. In some embodiments, for example, an exposure time of about 2 seconds or 5 seconds is found to be sufficient. Given the directions and parameters provided herein, one of skill in the art will be able to readily determine the appropriate conditions for effective use of a given catalyst in accordance with the present invention.

After the catalyst layer is formed an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Following the chamber purge, the catalyst-activated substrate surface is exposed to a silicon-containing precursor gas under conditions selected for growth of a dielectric film. Any suitable silicon-containing precursor that can sufficiently adsorb onto and react with the catalyst-activated substrate surface to form a conformal dielectric film may be used. In addition, in an RVD embodiment, the silicon-containing precursor should be capable of polymerization when exposed to the adsorbed catalyst-activated substrate surface to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy) silanol(($C_5H_{11}O)_3SiOH$), di(tert-butoxy)silandiol (($C_4H_9O)_2Si(OH)_2$) and methyl di(tert-pentoxy)silanol.

While the invention is not limited to this theory of operation, as mentioned previously, it is believed that the accumulation of dielectric film is achieved via a polymerization process. The saturated layer of catalyst (e.g., Al or $Al_2O_3$) can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon-containing precursor is exposed to the saturated layer of aluminum atoms, for example. The film can also be made thicker by repeating the number of precursor deposition cycles. Studies regarding these finding can be found in the doctoral thesis of Dennis Hausmann, Harvard University, (2002).

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. Temperatures can range from about 20 to 300° C. A typical deposition temperature is about 20-250° C. Pressures can range broadly, e.g., between about 1 mTorr and 760 Torr. Typical pressures range between about 10 mTorr and 750 mTorr. Flow rates of silicon-containing precursor gas can range broadly, e.g., between about 1 and 10000 sccm. Preferred flow rates of silicon-containing precursor gas range between about 10 and 1000 sccm. The dose of silicon-containing precursor can range broadly, e.g., between about 0.001 milligrams and 100 grams. Typical silicon-containing precursor doses range between about 0.1 and 2 grams. Exposure times can range broadly, e.g., between about 1 milliseconds and 1000 seconds. Preferred exposure times typically range between about 1 and 100 seconds.

As depicted in FIG. 1B, the conformal RVD deposition results in beneficial void-free filling of the trench 100. However there is still the potential for weak seam formation at the interface of deposition fronts in the center of the gap. In addition, a typical conformal process cannot fill reentrant structures in a case where a gap feature has a profile that is narrower at its opening than below the surface, for example, a gap that widens towards its bottom. Such gaps are often encountered at the STI and PMD levels of a microelectronic device.

The present invention addresses these issues. Following these initial deposition operations, the sidewall deposition is removed near the top of the trench in an etch back process to facilitate further void free filling of the gap. In a preferred embodiment, etch back is initiated when the partial filling of the gap is such that the gap opening is no less than about 40% of its initial width. The etch back part of the process is a plasma-based dry etch using substantially isotropic or a combination of isotropic and anisotropic chemistry and process conditions. Preferably, the etch process removes material from the top of the structure preferentially, without exposing the feature corners 109. Various etch apparatus, chemistry and conditions may be used. Suitable plasma reactors for conducting the etch have inductively coupled plasma (ICP) and/or remote plasma sources.

Figure 1C:
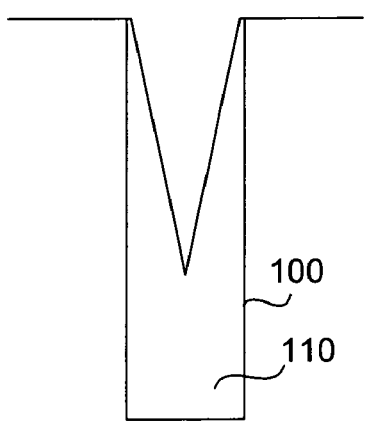

In one etch back process, the wafer is processed under substantially isotropic conditions. For example, the wafer is exposed to a radio frequency based inductively coupled plasma containing fluorine etch chemistries, for example $NF_3$, and hydrogen may be used. This step removes dielectric from the gap 100 resulting in removal of the dielectric at the gap entry 108 and widening of the gap 100, thus reducing the aspect ratio of the partially filled gap, as illustrated in FIG. 1C, and facilitating further filling of the gap by subsequent dielectric deposition.

The etch stage can be a substantially isotropic process. For example, an inductively coupled $NF_3$ and $H_2$-based plasma is maintained with 4.5 kW of source power. The etch is described as "substantially" isotropic because it is conducted using a plasma source and etchant chemistry that impart an isotropic character to the etch. However, the substrate may be biased or unbiased, for example with a power range of about 0-5000 W. In some preferred embodiments, the substrate is biased with about 500-2000 W. Biasing the electrostatic chuck, where the substrate is placed, imparts some directionality to the etch plasma towards the wafer on the biased chuck. Thus, while the etch process of the present invention has a dominant isotropic character, it does favor the wafer when a bias is applied to the chuck holding the wafer. The etch process is referred to herein as substantially isotropic.

The etch plasma chemistry includes a fluorine (F)—containing etchant compound. Suitable examples include $F_2$, HF, $NF_3$, $CF_4$, $C_2F_6$, $CHF_3$ and $SF_6$. $NF_3$ is a preferred etchant in some embodiments. The etch chemistry also includes hydrogen ($H_2$). In addition, the etch plasma chemistry includes an inert carrier gas, which may be He, Ar or $N_2$, with He being preferred. $O_2$ may optionally be included in the etch chemistry, particularly to the extent that it enhances plasma stability.

An $H_2$/He/$NF_3$-based chemistry is preferred in one embodiment of the invention. Typical process parameter ranges for inductively coupled plasma process gases in accordance with the present invention and reactor conditions are listed as follows:

| Wafer temp (° C.) | 250-700 |
|---|---|
| $NF_3$ (sccm) | 50-1000 |
| $H_2$ (sccm) | 50-2000 |
| He (sccm) | 50-1000 |
| $O_2$ (sccm) | 0-500 |
| Pressure (mTorr) | 0.2-100 |
| Bias (HF RF) Power (W) | 0-5000 |
| Source (LF) Power (W) | 2000-8000 |

In a preferred embodiment, the etch process chemistry and reactor conditions are as follows:

| Wafer temp (° C.) | 350-650 |
|---|---|
| $NF_3$ (sccm) | 100-200 |
| $H_2$ (sccm) | 50-750 |
| He (sccm) | 50-200 |
| $O_2$ (scorn) | 0-200 |
| Pressure (mTorr) | 0.5-20 |
| Bias (HF RF) Power (W) | 500-2000 |
| Source (LF) Power (W) | 2000-5000 |

The $H_2$/$NF_3$ gas flow ratio is preferably from about 1:1 to about 15:1, depending upon the high frequency and low frequency (LF/HF) power settings. In one specific preferred embodiment, a $H_2$/$NF_3$ gas flow ratio is about 5:1 is used.

The conditions are preferably set so that the etch is selective for the deposited dielectric (e.g., $SiO_2$) relative to the silicon nitride barrier layer lining the trench. Adjustment of the process selectivity is within the skill in the art given the process parameters and description provided herein.

In another embodiment, the etch back process is a multi-step (e.g., two-step) etch back process to facilitate further void free filling of the trench. In a preferred embodiment, a two-step etch back process is carried out in a separate reactor chamber than the deposition chamber.

In a first step of the etch back process, the wafer is processed under substantially anisotropic conditions. In this step, the top surface of the deposited dielectric 110 is etched preferentially with minimal removal of any dielectric from the bottom and sidewalls of the gap 100, for example using a reactive ion etch (RIE) with fluorine chemistries. This top and sidewall characteristic of the etch is believed to be due to the relatively high process pressure and the directionality of the etch, respectively. Note that this invention is not limited to any particular mechanism of deposition or etch back action. This first etch back step has been shown to widen the entry 108 of the gap 100, as illustrated in FIG. 1C.

In a specific embodiment, the first etch step is an anisotropic process that utilizes higher process pressures and lower process power than the deposition process. For example, an RIE configured reactor with low power (e.g., about 100 to 1000 W, for example, 500 W), a biased chuck, a process pressure of about 200-800 mTorr and a $CF_4$-based chemistry may be used. While He/$CF_4$-based chemistry is preferred in one embodiment of the invention, the anisotropic etch step can be realized using other F-bearing compounds (e.g., $C_2F_6$, $CHF_3$, $NF_3$, $SF_6$, etc.) and inert gases (e.g., Ar, $N_2$). Typical process parameter ranges for the RIE etch process gases of the present invention and reactor conditions are listed below.

| Platen temp (° C.) | 10-60 |
|---|---|
| $CF_4$ (sccm) | 20-100 |
| He (sccm) | 50-200 |
| Pressure (mTorr) | 150-500 |
| RF Power (W) | 100-1000 |
| Time (s) | 10-120 |

In a preferred embodiment, the anisotropic etch process chemistry is as follows:

| Platen temp (° C.) | 20 |
|---|---|
| $CF_4$ (sccm) | 50 |
| He (sccm) | 150 |
| Pressure (mTorr) | 200-220 |
| RF Power (W) | 450 |
| Time (s) | 40 |

The parameter values above are in reference to a 200 mm chamber. The process can be implemented in a 300 mm chamber as well. In that case, the flows need to be scaled-up accordingly. This first step of the two-step dry etch process reduces the exaggerated constriction at the top of gap following deposition and can be controlled so as not to expose underlying layers of silicon nitride and silicon.

In the second step of the etch back process, the wafer is processed under partially or substantially isotropic conditions. For example, the wafer is exposed to a downstream plasma flow containing fluorine chemistries. This step removes the dielectric isotropically from the gap 100 resulting in widening of the gap, thus reducing the aspect ratio of the partially filled gap, and facilitating further filling of the gap by subsequent conformal dielectric deposition.

In a preferred embodiment, the second etch step is an isotropic process that utilizes higher process pressures than the first etch step. For example, a microwave downstream plasma configured reactor with 2 KW power (e.g., about 1000 to 2000 W, for example, 1700 W), an unbiased chuck, a process pressure of about 1-3 Torr and an $NF_3$-based chemistry may be used. While $He/NF_3$-based chemistry is preferred in one embodiment of the invention, the isotropic etch step can be realized using other F-bearing compounds (e.g., $C_2F_6$, $CF_4$, $SF_6$, etc) and inert gases (e.g., Ar, $N_2$). Typical process parameter ranges for microwave downstream etch process gases in accordance with the present invention and reactor conditions are listed below.

| | |
|---|---|
| Platen temp (° C.) | 10-60 |
| $NF_3$ (sccm) | 200-1000 |
| He (sccm) | 500-2500 |
| Pressure (Torr) | 1-3 |
| MW Power (W) | 1000-2000 |
| Time (s) | 5-50 |

In a preferred embodiment, the isotropic etch process chemistry is as follows:

| | |
|---|---|
| Platen temp (° C.) | 20 |
| $NF_3$ (sccm) | 750 |
| He (sccm) | 1250 |
| Pressure (Torr) | 2 |
| MW Power (W) | 1700 |
| Time (s) | 15 |

The conditions are preferably set so that the isotropic etch is selective for the deposited dielectric (e.g., $SiO_2$) relative to the silicon nitride barrier layer lining the trench. Adjustment of the process selectivity is within the skill in the art given the process parameters and description provided herein.

The second step of the two-step dry etch process removes oxide from sidewalls and opens the gap for access of silicon containing precursor gases in a subsequent RVD gap fill operation.

Following the etch back stage, a passivation step may be used to treat the surface of the etch dielectric. This can be accomplished by exposing the substrate to a reactive plasma (e.g., a hydrogen-containing plasma) that will scavenge much of the fluorine remaining in the dielectric and the chamber after the etch operation. In addition to hydrogen, the process gas may contain one or more of helium, argon, xenon, and/or oxygen. In a preferred embodiment, molecular hydrogen is provided to the passivation reactor at a flow rate of between about 100 and 5000 sccm, more preferably between about 500 and 3000 sccm. The other components of the process gas may be provided at flow rates within the following ranges for example: oxygen at between about 0 and 500 sccm and argon or other inert gas at between about 0 and 200 sccm.

As with the etch operation, passivation is preferably conducted with a high-density plasma in an HDP CVD reactor. The high frequency electrode preferably operates at a power of between about 0 and 5 kilowatts and more preferably between about 0 and 2 kilowatts. The low frequency power associated with the passivation is preferably between about 1 and 20 kilowatts and more preferably between about 3 and 8 kilowatts. During passivation, the temperature of the substrate if preferably maintained between about 100 and 700 degrees centigrade and more preferably between about 300 and 550 degrees centigrade. The pressure within the etching reactor is preferably maintained at a value below about 500 mTorr, more preferably between about 5 and 500 mTorr. The duration of the passivation step varies depending upon how much etching and passivation must occur as well as the aggressiveness of the etching and passivation conditions. In a typical process, exemplified with HDP etch conditions as described above, the duration of the passivation step lasts for between about 0 and 700 seconds, more preferably between about 5 and 300 seconds.

Figure 1D:
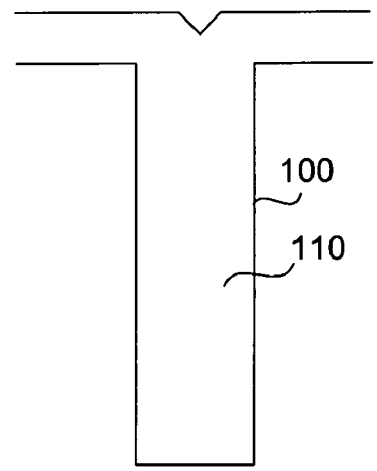

Following the etch back stage, an additional RVD deposition is performed in order to further fill the gap 100 with dielectric 110, as shown in FIG. 1D. The profile of the partially-filled gap following etching allows for void free gap fill with conformal dielectric deposition. For example, as illustrated in FIG. 1C, the opposing advancing faces of the conformally deposited film are no longer parallel. Thus the gap will fill without risk of a weak seam developing and the interface. In reentrant features, this characteristic of the method of the present invention can result in a change to the profile of the partially-filled gap such that it is less or no longer reentrant and is now susceptible of void free fill by conformal deposition.

The etch back and deposition steps depicted in FIGS. 1C and D can then be repeated, as needed, until the gap is filled. For a gap with about a 6:1 aspect ratio and about a 1000 Å width, three to five, for example four, iterations of the etch back and deposition steps are typical to obtain void free filling of the gap.

Figure 2:
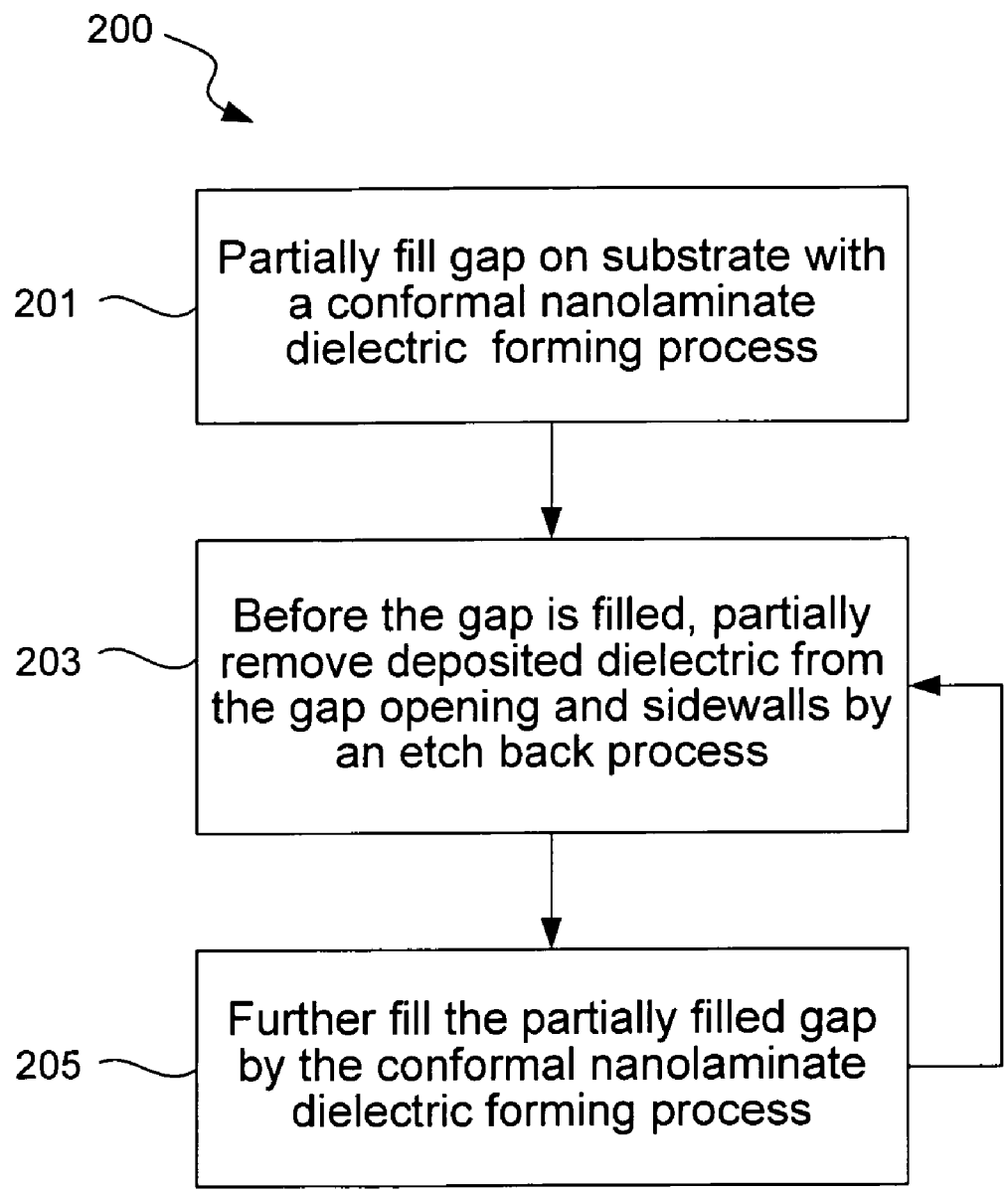
FIG. 2 is a process flow diagram depicting important operations in a multi-step gap fill process in accordance with the present invention.

FIG. 2 is a process flow diagram depicting important operations in a gap fill method in accordance with the embodiment using a conformal nanolaminate dielectric (e.g., silica nanolaminate) forming process (201), in particular RVD or ALD, such as by exposing the substrate surface to a catalyst- or catalyst-containing precursor gas to form a catalytically-activated substrate surface, and then exposing the substrate surface to a silicon-containing precursor gas to form a conformal dielectric film layer. Before the gap is filled, dielectric deposited in the gap is partially removed from the gap opening and sidewalls by an etch back process that is generally preferential for the dielectric at the top of the partially filled gap, such as a single step partially isotropic process or a multi-step process including an anisotropic dry etch followed by an isotropic dry etch (203). Then, further filling of the partially filled gap by the conformal nanolaminate dielectric process is conducted (205). The etch and deposition operations can be repeated until the gap is filled, as indicated by the arrow.

Apparatus

The deposition and etch operations can be carried out in situ, or in different chambers, for example in a cluster tool with different chambers without a vacuum break.

Figure 3:
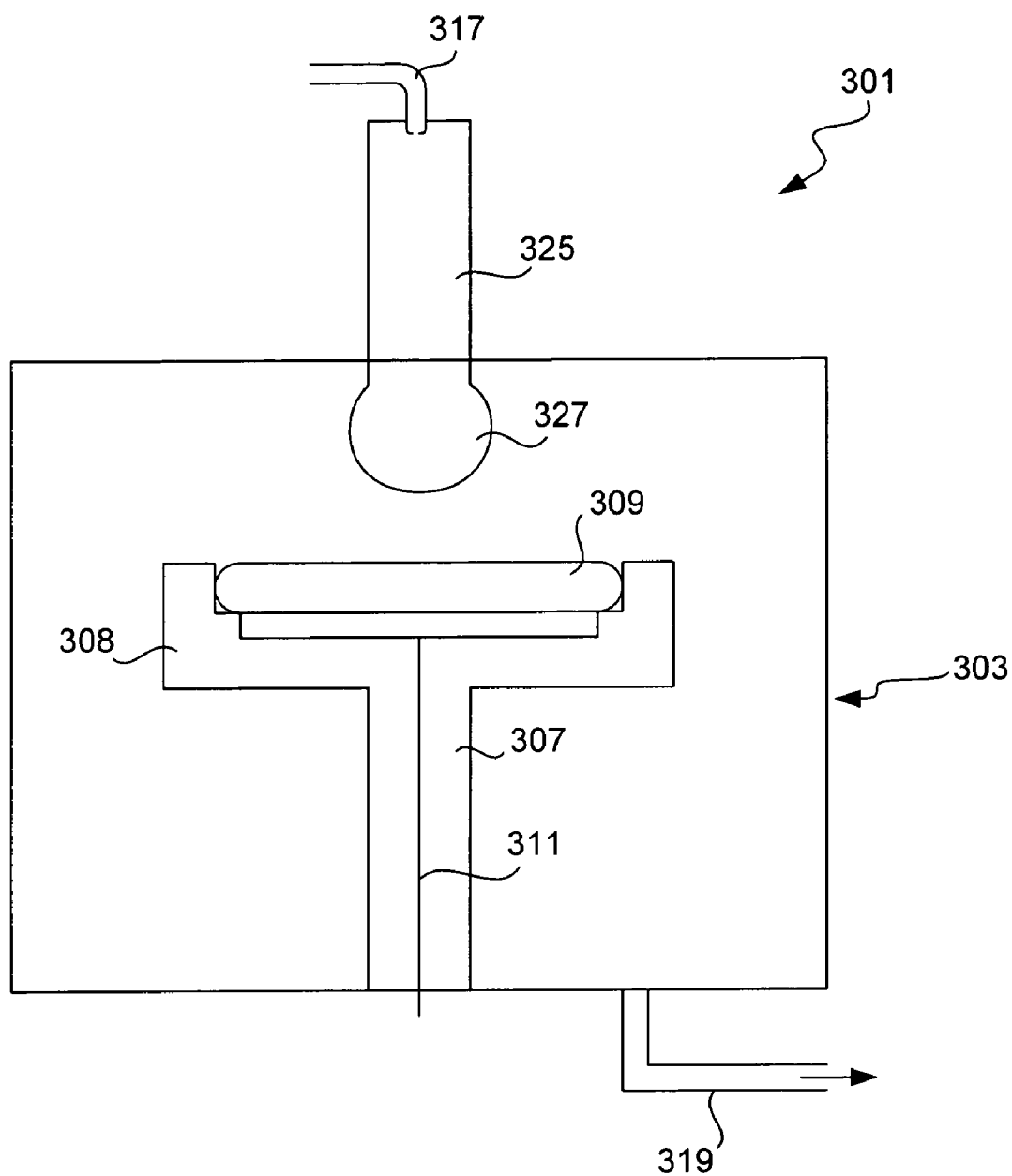
FIG. 3 is a block diagram depicting some components of a suitable reactor for performing dielectric deposition using a conformal nanolaminate dielectric deposition process (e.g., RVD or ALD) in accordance with one embodiment of this invention.

FIG. 3 is a block diagram depicting some components of a suitable reactor for performing dielectric deposition using a nanolaminate dielectric deposition process (e.g., RVD or ALD) in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 301 includes a process chamber 303, which encloses components of the reactor and serves to contain the reactant gases and provide and area to introduce the reactant gases to substrate 309. The chamber walls may be made of or plated with any suitable material, generally a metal that is compatible with the deposition and associated processes conducted therein. In one example, the process chamber walls are made from aluminum. Within the process chamber, a wafer pedestal 307 supports a substrate 309. The pedestal 307 typically includes a chuck 308 to hold the substrate in place during the deposition reaction. The chuck 308 may be an electrostatic chuck, a mechanical chuck or various other types of chuck as are available for use in the industry and/or research.

A heat transfer subsystem including resistive heating elements and lines 311 for supplying a heat transfer fluid to the pedestal 307 controls the temperature of pedestal 307. In some embodiments, the heat transfer fluid comprises water or another liquid. The reactant gases, as well as inert gases during purge, are introduced individually into the reactor via inlet 317. A showerhead 327 may be used to distribute the gas flow uniformly in the process reactor. Reactant gases are introduced through a gas supply inlet mechanism including orifices. There may be multiple reactant gas tubes and inlets. A vacuum pump) connected to outlet 319 can draw out gases between RVD cycles.

For etch operations, various plasma etch reactor designs are suitable for use with this invention, and the particular design is not critical to this invention. It merely needs to support the required partially isotropic or anisotropic and isotropic etch functions.

The principal components of most suitable reactors include an in situ or a downstream plasma source, a process gas delivery system, a process chamber, a support for the substrate within the process chamber, one or more electrodes to generate a plasma and a bias source for the substrate within the process chamber. A temperature control system is typically used to control the temperature of the substrate.

For a single step or multi-step etch back process, an HDP CVD reactor is one preferred embodiment. Examples of suitable reactors include the SPEED reactor available from Novellus Systems, Inc. of San Jose, Calif. and the Centura Ultima reactor available from Applied Materials of Santa Clara, Calif.

Figure 4:
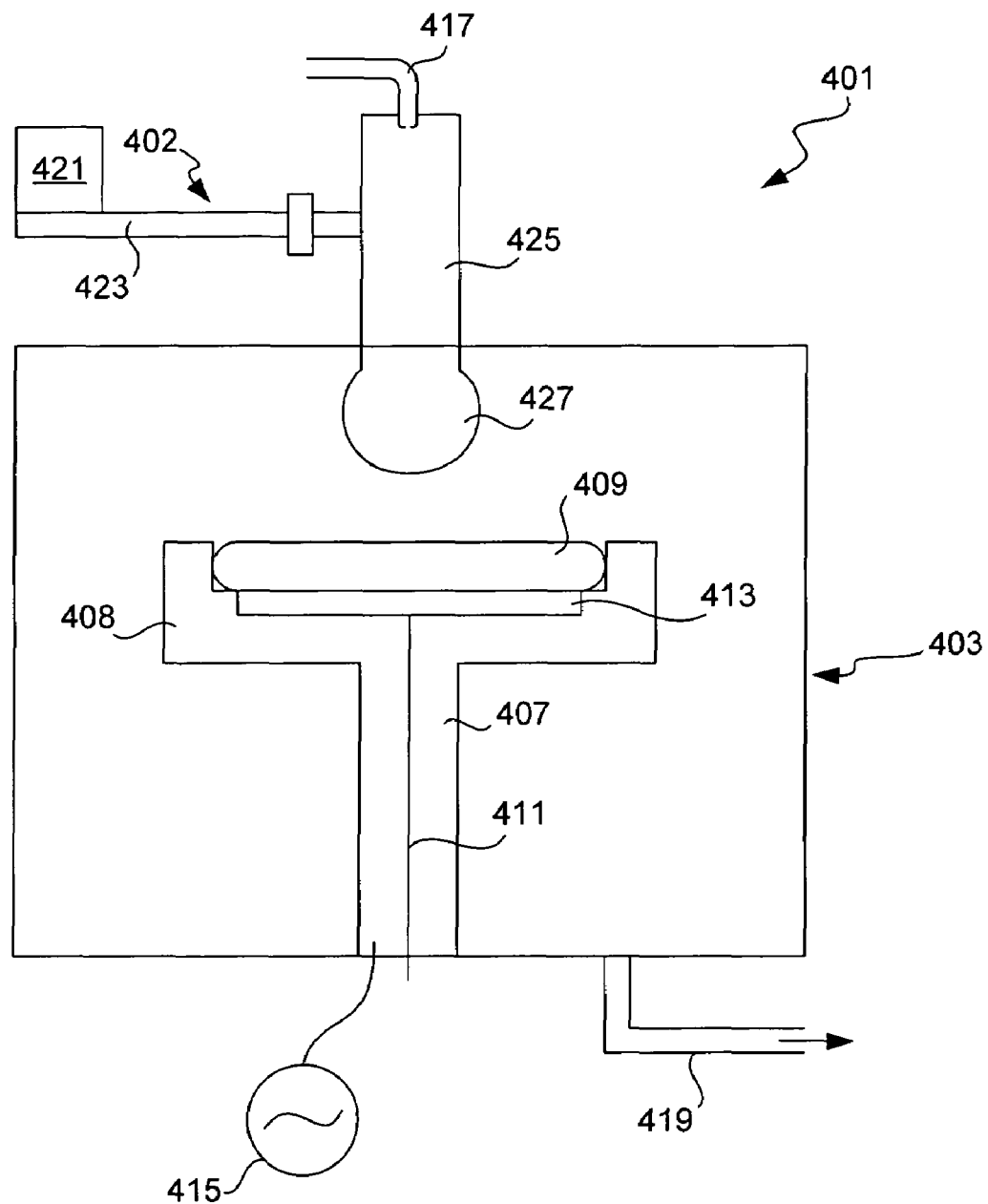
FIG. 4 is a block diagram depicting some components of a suitable dual source RF/microwave plasma reactor for performing etch back in accordance with an embodiment of this invention.

FIG. 4 is a block diagram depicting some components of a suitable dual source RF/microwave plasma reactor for performing etch back in accordance with this invention. As shown, a reactor 401 includes a microwave downstream plasma source 402 and a process chamber 403 which encloses other components of the reactor and serves to contain the plasma generated by an RF power source to the pedestal 407. In one example, the process chamber walls are made from aluminum.

Within the process chamber, a wafer pedestal 407 supports a substrate 409. The pedestal typically includes a chuck 408 to hold the substrate in place during the deposition reaction. The chuck 408 may be an electrostatic chuck, a mechanical chuck or various other types of chucks as are available for use in the industry and/or research.

A heat transfer subsystem including lines 411 for supplying a heat transfer fluid to the pedestal 407 controls the temperature of pedestal 407. In some embodiments, the heat transfer fluid comprises water or another liquid. The etchant process gases are introduced into the reactor at plasma tube 425 in the microwave downstream plasma source 402 via inlet 417. The process gases pass through the microwave downstream plasma tube 425 and are introduced into the process chamber 403. A showerhead 427 may be used to distribute the gas flow uniformly in the process reactor.

Microwave power, generated by a magnetron 421 and transmitted to the remote plasma tube via a waveguide 423 may, or may not, be applied to the gases to generate a plasma prior to the gases introduction into the process chamber. Typically, for anisotropic etching, the microwave power is not turned on while the RF plasma is used in the process chamber to effect the directional anisotropic etch. In the case of isotropic etching, the microwave power is applied to generate the plasma, while the RF is typically turned off in the process chamber to effect a purely chemical isotropic etch. But, in some instances, both sources may be used simultaneously for either the anisotropic and/or the isotropic etch steps. The gases may be premixed or not. Preferably, the process gas is introduced through a gas supply inlet mechanism including orifices.

For anisotropic etching, the chamber operates in RIE mode. A "high frequency" RF source 415 serves to electrically generate a plasma, bias the substrate 409 and draw charged precursor species onto the substrate for the anisotropic etch reaction. Electrical energy from source 415 is coupled to substrate 409 via the pedestal 413 which acts as the cathode. The grounded process chamber walls act as the anode. In a specific embodiment, source 415 supplies a radio frequency bias to the substrate, and the radio frequency bias is generated by supplying the electrode with at least $0.32\ W/cm^2$ of power.

For isotropic etching, the reactor operates in microwave downstream plasma mode. Microwave power generates plasma in the plasma tube 425. The reactive gases generated from the plasma are transmitted to the process chamber 403 through a showerhead 427, generally spherical in shape, which distributes the reactive gases uniformly in the chamber, including on the substrate. The reactive gases generated are composed primarily of radicals (neutral species) and some ions. The ions in the reactive gases recombine on the tube and showerhead walls leaving the neutral reactive species to chemically etch the substrate isotropically. In a specific embodiment, the magnetron 421 supplies at least 1000 watts of microwave power to the plasma. The process gas exits chamber 403 via an outlet 419. A vacuum pump (e.g., a turbomolecular pump) typically draws the gas out and maintains a suitably low pressure within the reactor. As an alternative to microwave, an ICP etch may be used as the downstream isotropic etch. An ICP direct plasma source may also be used for the etch process. The SPEED reactor of Novellus Systems, Inc. is a typical chamber where RF power can be used to generate a direct ICP plasma, which can be used for the etch process. See also FIG. 5A and associated description in application Ser. No. 11/366,220, incorporated herein by reference.

For the optional passivation process, the dielectric layer can be exposed to a plasma generated from a fluorine-reducing gas such as hydrogen. This passivation step can be performed in the same reactor as the previous etch step. A suitable chamber includes, but is not limited to, an HDPCVD such as the SPEED reactor available from Novellus Systems, Inc.

Figure 5A:
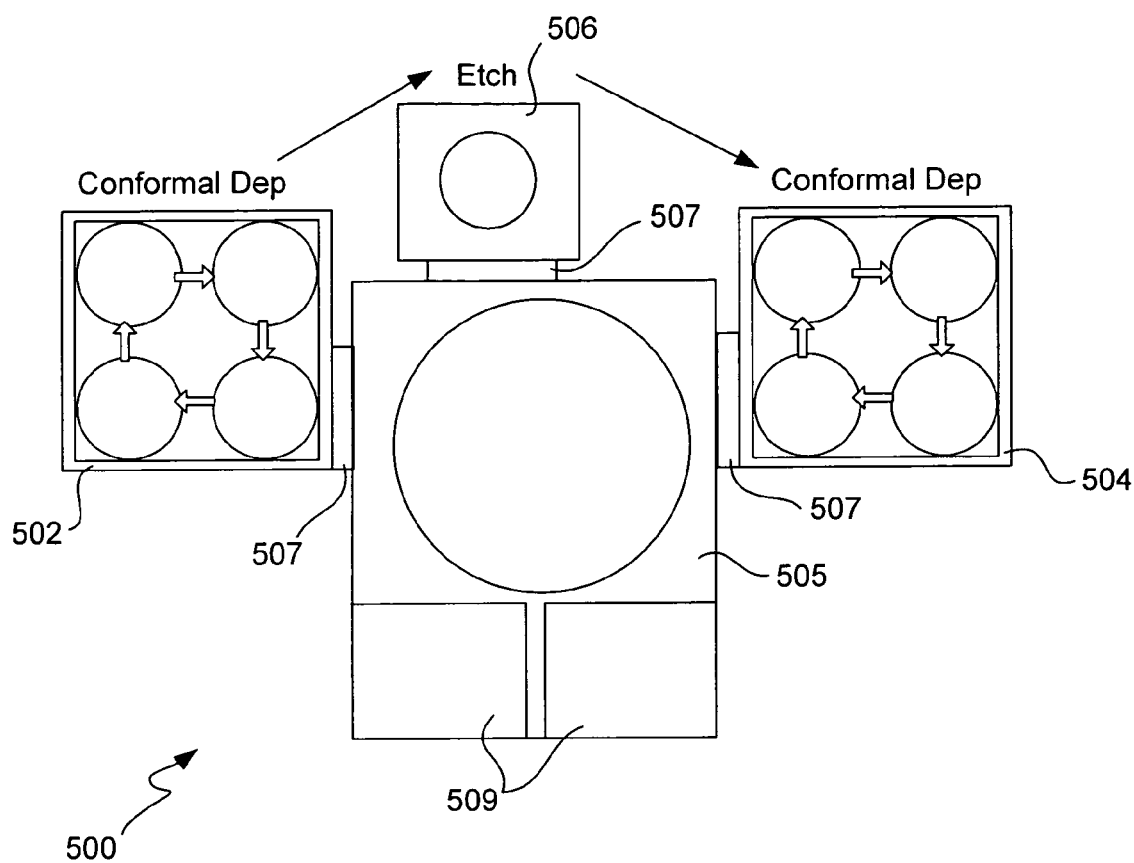
FIGS. 5A-C illustrate multi-station semiconductor processing apparatus configurations suitable for implementation of conformal nanolaminate dielectric deposition and etch back processes in accordance with embodiments of this invention.
Figure 5B:
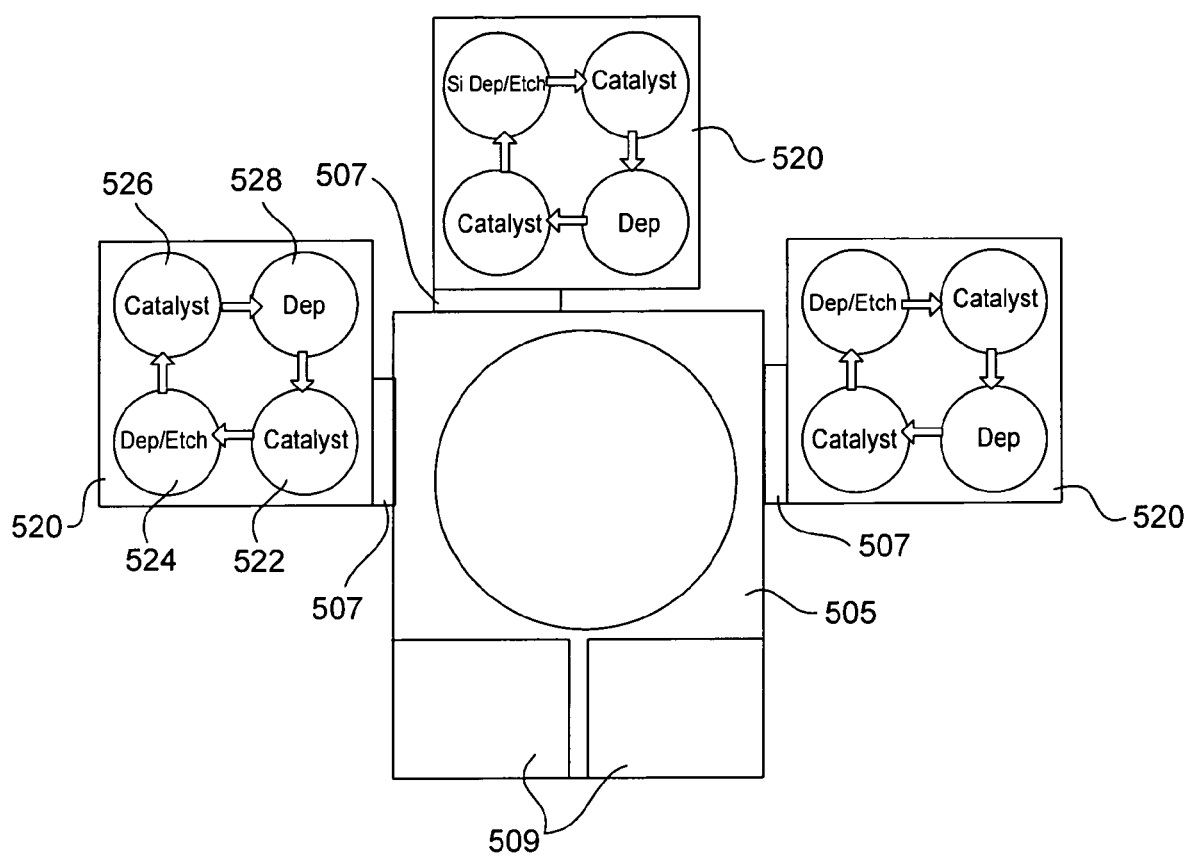
Figure 5C:
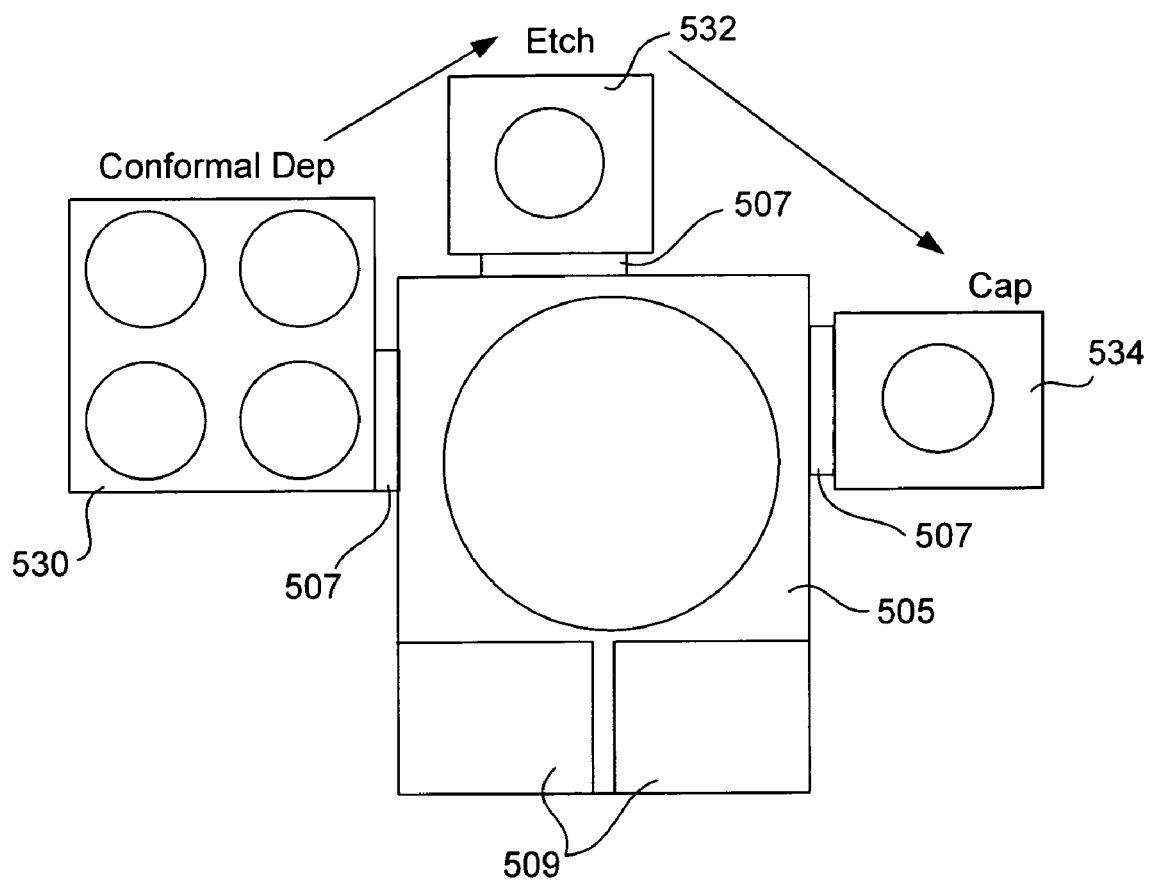

As noted above, in some embodiments, the method of the invention may be implemented in multi-station semiconductor processing apparatus. Examples of such apparatus are illustrated in FIGS. 5A-C. Referring to FIG. 5A, a simplified schematic diagram of a deposition multi-station semiconductor processing apparatus is depicted. The figure shows relevant features of a three-chamber reactor 500 incorporating two multi-station chambers (process modules) 502, 504 for conducting deposition in accordance with the present invention and a single station chamber 506 for conducting etch. Each process module is physically connected to a wafer transfer module 505 via airtight doors 507, one for each chamber, to separate the process modules 502, 504, 506 from the wafer transfer module 505. In order to avoid contamination of the wafer transfer module 505 by chemicals used for deposition in process modules when the airtight doors 307 are opened, the pressure in the wafer transfer module is generally kept slightly higher than that in each station. For example, a ΔP of about 0.2-0.7 Torr (e.g., 0.5) may be used. Vacuum pumps 509 are used to maintain the proper level of vacuum in the reactor 500.

A wafer handler (not shown) is used to transfer wafers into wafer transfer module 505. Semiconductor wafers are generally supplied to the process modules via wafer cassettes. For example, typical wafer cassettes can hold 25 300 mm wafers each.

In the specific case of RVD $SiO_2$, a station in each of the deposition modules 502, 504 is dedicated to exposure of the catalyst (e.g., aluminum-containing precursor), while the another station is dedicated to exposure of silanol or another silicon-containing precursor. Individual stations can be constructed or lined with materials suitable for the processes which will be performed within each station. By way of example a Nickel-plated station may be used for aluminum deposition (since Ni is resistant to Cl, which is used for in situ cleaning of aluminum oxide). Similarly, an aluminum station may be used for silica deposition, since it is resistant to Fluorine etchants. The depicted deposition modules 502, 504 have four stations each with a single robotic spindle mechanism for moving between stations. In RVD implementations, some stations are used to apply a catalytic precursor only, such as TMA, and some stations are used to apply a silicon-containing precursor.

The number of stations in a particular reactor will depend upon available space, but typically the number of each kind of station is a multiple of the number of reactants used in the process. As an example, if two reactants are used, then there may be two, four or six stations (for instance, four: two of reactant A and two of reactant B). If three reactants are used, then there could be three or six stations (for instance, six: two of reactant A, two of reactant B, and two of reactant C).

Typically, the order of running the wafers would be sequentially from a station running reactant A, then to B, etc., as illustrated by the arrows in each deposition module 502, 504 in the figure, with a repetition of this cycle if there were more than one of each kind of station or by returning the wafers to the stations that had already been visited. An example of a multi-station reactor module suitable for conducting RVD-based conformal dielectric deposition is depicted in the reactor embodiment of FIG. 5A. The four station deposition modules 502, 504 have two stations of reactant A (catalyst) and two stations of reactant B (silicon-containing). Upon entering the first module 502, the wafer is placed on the first station which would deposit reactant A. The wafer is then moved by the spindle mechanism to the second station, where reactant B is deposited. The wafer is then moved to the third station where a second layer of reactant A is deposited. The wafer is then moved to the fourth station and a second layer of reactant B is deposited. At this point, the wafers are removed from the first deposition module 502 and transferred to the etch module 506 via the transfer module 505. In the etch module 506, each wafer is etched, as described above, to partially remove the deposited dielectric. If desired, each wafer may be passivated after the etch is complete. Then, the wafers are removed from the etch module 506 and transferred to the second deposition module 504 via the transfer module 505. In the second deposition module 504, deposition proceeds as described above with reference to the first deposition module 502 to further fill gaps on the wafers.

Referring to FIG. 5B, an alternate configuration for a multi-station process reactor in accordance with the present invention is depicted. In this reactor, three process modules of the same type 520 are provided for higher throughput purpose. The three process chambers are connected through one wafer transfer system. The other aspects of the each reactor are as described above with reference to FIG. 5A. Each process module 520 has a first catalyst application station 522, a second station 524 at which silica deposition and etching are conducted, a second catalyst application station 526 and a final silica deposition station 528. In this configuration, the substrate is first exposed to catalyst reactant A on station 522, and the wafer is then moved to station 524 for two consecutive process steps. In the first step, the substrate is exposed to reactant B to achieve a conformal deposition in order to fill the gap. The chamber is then pumped down to base pressure, and purged to eliminate any residual reactant B.

An etching chemistry is then flowed, very similar to the chemistry and set-up of the etch module 506, described above. In this case, the showerhead and pedestal can both be powered with RF to enable isotropic and anisotropic etch. The wafer is etched to partially remove the deposited dielectric. If desired, each wafer may be passivated after the etch is complete.

Then, the wafer is removed from the station 524, and transferred to the second catalyst station 526 where reactant A is flowed. The wafer will continue to move to station 528 where a final deposition is completed. If desired, this sequence from station 522 through station 528 can continue for multiple cycles in order to achieve a completely void-free fill result. This configuration and approach described with reference to FIG. 5B is particularly beneficial for high throughput where a very short deposition and etch are required for the initial layer of dielectric film.

Yet another possible configuration for a multi-station process reactor in accordance with the present invention is depicted in FIG. 5C. In this reactor, a conformal deposition process module 530, like modules 502 and 504 of FIG. 5A, an etch module 532, like etch module 506 of FIG. 5A, and a cap module 534, are provided. The cap module 534 is a high density plasma (HDP) deposition system such as the Novellus SPEED module. After the deposition and etch process in modules 530 and 532, a film is left on the bottom of the trench, generally reducing the aspect ratio of the trench, and therefore enhancing the gap fill capability of HDP deposition. The other aspects of the reactor are as described above with reference to FIG. 5A.

These three embodiments exemplify possible multi-station reactor configurations suitable for implementation of a conformal nanolaminate dielectric deposition and etch back process in accordance with the present invention. As will be understood, many other suitable configurations are possible and would be apparent to those of skill in the art given the parameters provided herein.

Various details of the apparatus have been omitted for clarity's sake, and various design alternatives may be implemented.

Substrates

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), inter-metal layer dielectric (ILD) layers, passivation layers, etc.

As indicated, the invention can effectively fill gaps having widths of 0.15 microns or less, for example 0.1 micron or less, and aspect ratios of 3:1 or greater, for example 5:1, 6:1, or even 10:1 or greater. More aggressive structures having, e.g., greater aspect ratios and smaller widths may also be used. In one example the gap width is 0.13 micrometers or less, e.g., between 0.09 and 0.04 micrometers.

OTHER EMBODIMENTS

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (e.g., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The technique can be used in combination with alumina films formed by the ALD reaction of TMA and water. The above-referenced applications are incorporated by reference in their entirety for all purposes.

CONCLUSION

The disclosed method applies to the gap fill deposition of conformal nanolaminate dielectrics (e.g., silica nanolaminates) deposited using intermediate etch back processing. This method can be used to prevent the occurrence of seams in the material deposited in trenches and improve gap fill performance. It pertains to IMD, STI and PMD applications. While described primarily with reference to silicon dioxide herein, the method may also be used for depositing doped silica films, such as FSG, PSG, BPSG, or carbon doped low-k materials.

Although the foregoing invention has been described in some detail for purposes of clarity of understanding, it will be apparent that certain changes and modifications may be practiced within the scope of the appended claims. It should be noted that there may be alternative ways of implementing the present invention. For example, while the invention has been described primarily with reference to a RVD embodiment herein, the invention is also applicable to other multi-step chemical deposition techniques, such as ALD. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

What is claimed is:

1. A method of filling a gap on a semiconductor substrate, the method comprising:
    (a) partially filling the gap with a dielectric using a conformal deposition process;
    (b) partially removing dielectric deposited in the gap from the gap opening and sidewalls by an etch back process comprising an isotropic dry etch, wherein the etch back process comprises a passivation operation after the etch is complete; and
    (c) further filling the partially filled gap by the conformal deposition process.

2. The method of claim 1, wherein the conformal deposition process comprises:
    a. exposing the substrate surface to a catalyst or catalyst-containing precursor gas to form a saturated layer of catalyst on the substrate surface; and
    b. exposing the substrate surface to a silicon-containing precursor gas to form a dielectric film layer.

3. The method of claim 2, wherein the catalyst or catalyst-containing precursor is a metal catalyst-containing precursor is selected from the list of metal catalyst-containing precursors comprising aluminum, zirconium, hafnium, gallium, titanium, niobium, tantalum, and combinations thereof.

4. The method of claim 3, wherein the metal catalyst-containing precursor is at least one of hexakis(dimethylamino) aluminum and trimethyl aluminum.

5. The method of claim 2, wherein the catalyst or catalyst-containing precursor is a metal- and metalloid-free catalyst that can sufficiently adsorb onto or react with the substrate surface and prepare it to react with the subsequently added silicon-containing precursor to form a dielectric layer more than a monolayer thick.

6. The method of claim 5, wherein the catalyst is selected from the group consisting of organic acids, anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids, anhydrides of inorganic acids, and combinations thereof.

7. The method of claim 1, wherein the silicon-containing precursor is at least one of a silanol and a silanediol.

8. The method of claim 1, wherein (a) is performed with a process gas mixture comprising a silanol, nitrogen, ozone, and an inert gas.

9. The method of claim 1, wherein the silicon-containing precursor is at least one of tris(tert-butoxy)silanol (($C_4H_9O$)$_3$SiOH) and tris(tert-pentoxy)silanol (($C_5H_{11}O$)$_3$SiOH).

10. The method of claim 1, wherein the conformal dielectric is undoped silicon oxide nanolaminate.

11. The method of claim 1, wherein the conformal dielectric is doped silicon oxide nanolaminate.

12. The method of claim 11, wherein the doped silicon oxide nanolaminate comprises one selected from the group consisting of FSG, PSG, BPSG, and combinations thereof.

13. The method of claim 1, wherein (b) is initiated when the partial filling of the gap is such that the gap opening is no less than about 40% of its initial width.

14. The method of claim 1, wherein the etch back process comprises a single step downstream plasma isotropic etch.

15. The method of claim 1, wherein the etch back process comprises a single step direct plasma partially isotropic etch.

16. The method of claim 1, wherein the etch back process comprises a multi-step etch back process comprising an anisotropic dry etch followed by the isotropic dry etch.

17. The method of claim 1, wherein the dry etch back process conducted in a dual source plasma reactor process chamber comprising an RF source used to generate a plasma for an anisotropic reactive ion etch in the reactor process chamber and a downstream plasma source selected from the group consisting of a microwave source and an inductively coupled plasma source used to generate a plasma for an isotropic reactive ion etch in the reactor process chamber.

18. The method of claim 1, wherein the isotropic etch is selective to the dielectric relative to an underlying gap liner.

19. The method of claim 1, wherein the etch is stopped before corners of elements forming the gap are exposed.

20. The method of claim 1, wherein the etch is preferential for dielectric towards the top of the gap.

21. The method of claim 1, wherein the passivation operation comprises exposing the substrate to a reactive plasma that scavenges remaining etchant gases and byproducts.

22. The method of claim 21, wherein the passivation operation comprises exposing the substrate to a high density plasma comprising a hydrogen-containing gas.

23. The method of claim 20, wherein a partially-filled gap profile having a wider entry than bottom results from the etch.

24. The method of claim 1, wherein the deposition is conducted in a chemical vapor deposition reactor process chamber.

25. The method of claim 1, wherein the deposition and etch back steps are conducted in a single semiconductor processing device with multiple reactor chambers.

26. The method of claim 1, wherein (b) and (c) are repeated until the gap is filled.

27. The method in claim 1, wherein the gap is a feature selected from the group consisting of shallow trench isolation (STI), inter-metal dielectric (IMD), inter-level dielectric (ILD), and pre-metal dielectric (PMD) features in the partially fabricated semiconductor wafer.

* * * * *

UNITED STATES PATENT AND TRADEMARK OFFICE
CERTIFICATE OF CORRECTION

PATENT NO.         : 7,482,247 B1
APPLICATION NO. : 11/524502
DATED                : January 27, 2009
INVENTOR(S)       : Papasouliotis et al.

Page 1 of 1

It is certified that error appears in the above-identified patent and that said Letters Patent is hereby corrected as shown below:

IN THE TITLE PAGE:

In the (54) title section, please change "BAG" to --BACK--.

In the (75) inventor section, please change "Ron Rulkins" to --Ron Rulkens--.

Signed and Sealed this

Twenty-fourth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO.       : 7,482,247 B1
APPLICATION NO.  : 11/524502
DATED            : January 27, 2009
INVENTOR(S)      : Papasouliotis et al.

It is certified that error appears in the above-identified patent and that said Letters Patent is hereby corrected as shown below:

IN THE TITLE PAGE:

In the (54) title section, please change "BAG" to --BACK--.

In the (75) inventor section, please change "Ron Rulkins" to --Ron Rulkens--.

Column 1, line 2, please change "BAG" to --BACK--.

This certificate supersedes the Certificate of Correction issued March 24, 2009.

Signed and Sealed this

Fourteenth Day of April, 2009

JOHN DOLL
*Acting Director of the United States Patent and Trademark Office*